United States Patent
Yanai

(10) Patent No.: US 12,186,785 B2
(45) Date of Patent: Jan. 7, 2025

(54) METHOD OF CLEANING PIPE OF SINGLE-WAFER PROCESSING WAFER CLEANING APPARATUS

(71) Applicant: SUMCO Corporation, Tokyo (JP)

(72) Inventor: Ryoichi Yanai, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 18/248,924

(22) PCT Filed: Oct. 4, 2021

(86) PCT No.: PCT/JP2021/036680
§ 371 (c)(1),
(2) Date: Apr. 13, 2023

(87) PCT Pub. No.: WO2022/085414
PCT Pub. Date: Apr. 28, 2022

(65) Prior Publication Data
US 2023/0381834 A1    Nov. 30, 2023

(30) Foreign Application Priority Data

Oct. 23, 2020 (JP) ................................. 2020-178382

(51) Int. Cl.
*B08B 9/032* (2006.01)
*H01L 21/67* (2006.01)

(52) U.S. Cl.
CPC ...... *B08B 9/0328* (2013.01); *B08B 2209/032* (2013.01); *H01L 21/67023* (2013.01)

(58) Field of Classification Search
CPC ....... B08B 9/027–057; H01L 21/00–86; C23C 16/4405; C23C 16/4407
See application file for complete search history.

(56) References Cited

U.S. PATENT DOCUMENTS

| | | | |
|---|---|---|---|
| 7,306,001 B1 * | 12/2007 | Garcia, Jr. .............. | F28G 1/163 134/169 C |
| 2002/0195125 A1 * | 12/2002 | Jung ................. | H01L 21/67034 134/21 |
| 2003/0013310 A1 * | 1/2003 | Tomimori ................. | B08B 3/04 134/36 |

(Continued)

FOREIGN PATENT DOCUMENTS

| | | | |
|---|---|---|---|
| EP | 1221357 A1 | * | 7/2002 |
| GB | 2289512 A | * | 11/1995 |

(Continued)

OTHER PUBLICATIONS

Office Action issued in Corresponding KR Patent Application No. 10-2023-7006532, dated Mar. 26, 2024, along with an English translation thereof.

(Continued)

*Primary Examiner* — Mikhail Kornakov
*Assistant Examiner* — Richard Z. Zhang
(74) *Attorney, Agent, or Firm* — Greenblum & Bernstein, P.L.C.

(57) ABSTRACT

Provided is a method of preventing a sudden increase in the number of particles detected on wafer surfaces even when cleaning of a wafer is performed repeatedly using a single-wafer processing wafer cleaning apparatus. The method uses a single-wafer processing wafer cleaning apparatus including a rotatable stage; chemical solution supply nozzles; pure water supply nozzles; a chemical solution supply line for supplying chemical solutions to the chemical solution supply nozzles; a pure water supply line for supplying pure water to the pure water supply nozzles; and a waste liquid line. The method includes a pipe cleaning step of introducing pure water containing micro-nano bubbles into the pure water supply line, and cleaning the pipe of the pure water supply line.

7 Claims, 5 Drawing Sheets

(56) References Cited

U.S. PATENT DOCUMENTS

| | | | |
|---|---|---|---|
| 2003/0205326 A1* | 11/2003 | Miya | C23C 16/52 |
| | | | 156/345.47 |
| 2008/0142040 A1* | 6/2008 | Janzen | B24B 57/00 |
| | | | 134/22.12 |
| 2009/0114253 A1* | 5/2009 | Matsumoto | H01L 21/67034 |
| | | | 134/30 |
| 2012/0227761 A1* | 9/2012 | Leighton | B08B 3/12 |
| | | | 134/1 |
| 2013/0019902 A1* | 1/2013 | Ito | B08B 9/027 |
| | | | 134/22.11 |
| 2014/0345658 A1* | 11/2014 | Maruyama | H01L 21/67051 |
| | | | 134/56 R |
| 2015/0053239 A1* | 2/2015 | Abe | B08B 3/02 |
| | | | 134/28 |
| 2016/0037963 A1* | 2/2016 | Tuchrelo | A47J 31/60 |
| | | | 222/148 |
| 2017/0117165 A1* | 4/2017 | Kunisawa | H01L 21/68728 |
| 2018/0078978 A1* | 3/2018 | Kim | B08B 9/032 |
| 2018/0085795 A1* | 3/2018 | Tsuchihashi | H01L 21/67023 |
| 2019/0078198 A1* | 3/2019 | Umehara | H01L 21/67028 |
| 2019/0096706 A1* | 3/2019 | Kai | H01L 21/67051 |
| 2019/0314874 A1* | 10/2019 | Bodensteiner | B01F 25/312 |
| 2020/0164412 A1* | 5/2020 | Oh | B08B 9/053 |
| 2020/0398318 A1* | 12/2020 | Toyomasu | H01L 21/67051 |

FOREIGN PATENT DOCUMENTS

| | | | | |
|---|---|---|---|---|
| JP | 2009295655 A | * | 12/2009 | |
| JP | 2011-86659 A | | 4/2011 | |
| JP | 2018-121024 A | | 8/2018 | |
| JP | 2020-155649 A | | 9/2020 | |
| KR | 20000009262 A | * | 2/2000 | |
| KR | 20010054296 A | * | 7/2001 | |
| KR | 20090111089 A | * | 10/2009 | |
| KR | 10-2010-0050400 | | 5/2010 | |
| KR | 20170087081 A | * | 7/2017 | |
| KR | 10-1852705 | | 4/2018 | |
| KR | 10-2020-0061237 | | 6/2020 | |
| TW | 200911395 A | | 3/2009 | |
| TW | 201006575 A1 | | 2/2010 | |

OTHER PUBLICATIONS

International Search Report issued in International Patent Application No. PCT/JP2021/036680, dated Dec. 14, 2021, along with an English translation thereof.

Office Action issued in Taiwan Counterpart Patent Appl. No. 110138349, dated Aug. 26, 2022, along with an English translation thereof.

International Preliminary Report on Patentability issued in International Patent Application No. PCT/JP2021/036680, dated Apr. 13, 2023, along with an English translation thereof.

Office Action issued in Taiwan Counterpart Patent Appl. No. 111139623, dated May 22, 2023, along with an English translation thereof.

* cited by examiner

Prior Art

METHOD OF CLEANING PIPE OF SINGLE-WAFER PROCESSING WAFER CLEANING APPARATUS

TECHNICAL FIELD

This disclosure relates to a method of cleaning a pipe of a single-wafer processing wafer cleaning apparatus.

BACKGROUND

Conventionally, silicon wafers are used as substrates for semiconductor devices. A silicon wafer can be obtained by performing a wafer processing process on a single crystal silicon ingot grown, for example, by the Czochralski (CZ) process or the like. In the above processing process, particles such as polishing powder are deposited on the surfaces of the silicon wafer, and the particles are removed by performing cleaning on the silicon wafer after the processing process (for example, see PTL 1).

Cleaning apparatuses for semiconductor wafers such as silicon wafers include batch processing cleaning apparatuses that simultaneously clean a plurality of wafers and single-wafer processing cleaning apparatuses that clean wafers one by one. Of them, single-wafer processing cleaning apparatuses have come to be used in recent years, for example since the amount of a chemical solution required is relatively small, cross contamination between wafers can be avoided, and simultaneous processing of a plurality of wafers has become more difficult due to increasing diameter of the wafers.

FIG. 1 illustrates an example of a single-wafer processing wafer cleaning apparatus. The wafer cleaning apparatus 100 depicted in FIG. 1 includes a rotatable stage 11 on which a wafer W to be cleaned is placed; chemical solution supply nozzles 12 for supplying chemical solutions to the front and back surfaces of the wafer W placed on the stage 11; and pure water supply nozzles 13 for supplying pure water to the front and back surfaces of the wafer W.

The chemical solution supply nozzles 12 and the pure water supply nozzles 13 are constituted by upper nozzles 12a, 13a and lower nozzles 12b, 13b. A chemical solution supply line 14 through which a chemical solution such as ozone water, a hydrofluoric acid solution, or an ammonia-hydrogen peroxide mixture is supplied is connected to the chemical solution supply nozzles 12, and a pure water supply line 15 through which pure water is supplied is connected to the pure water supply nozzles 13. The number of such chemical solution supply nozzles 12 prepared may be correspond to the number of kinds of chemical solutions used. Further, around the stage 11, a spin cup 16 that receives the chemical solutions and pure water splashing during cleaning is placed to surround the wafer W.

Using the wafer cleaning apparatus 100 depicted in FIG. 1, the wafer W to be cleaned is cleaned for example as below. First, the wafer W is introduced into the wafer cleaning apparatus 100 and placed on a wafer retainer portion 11a of the stage 11. Next, while rotating the wafer W, the chemical solutions are sprayed onto the front and back surfaces of the wafer from the chemical solution supply nozzles 12 to clean the wafer W (wafer cleaning step). After completion of the cleaning step, pure water is sprayed to rinse the front and back surfaces of the wafer from the pure water supply nozzles 13 (wafer rinsing step). The chemical solutions and pure water splashing in the wafer cleaning step and the wafer rinsing step are received by the spin cup 16 and collected by a waste liquid line 17 to be discharged. Finally, the wafer W is rotated at a high rate to be dried (wafer drying step). Thus, the wafer W can be cleaned.

CITATION LIST

Patent Literature

PTL 1: JP 2011-086659 A

SUMMARY

Technical Problem

The wafer W having been undergone the cleaning step is delivered to a quality inspection step to be subjected to different quality inspections. When cleaning of a silicon wafer is performed repeatedly using the single-wafer processing wafer cleaning apparatus, particles detected on the wafer surfaces in the quality inspection step is found to suddenly increase in number.

This disclosure has been made in view of the above problem, and it could be helpful to provide a method of preventing a sudden increase in the number of particles detected on wafer surfaces even when cleaning of a wafer is performed repeatedly using a single-wafer processing wafer cleaning apparatus.

Solution to Problem

We propose the following features to solve the above problem.

[1] A method of cleaning a pipe of a single-wafer processing wafer cleaning apparatus, the apparatus comprising:
 a rotatable stage on which a wafer is placed;
 chemical solution supply nozzles through which a chemical solution is supplied to the wafer placed on the stage from either or both of the wafer front side and the wafer back side;
 pure water supply nozzles through which pure water is supplied to the wafer placed on the stage from the either or both of the wafer front side and the wafer back side;
 a chemical solution supply line through which the chemical solution is supplied to the chemical solution supply nozzles;
 a pure water supply line through which the pure water is supplied to the pure water supply nozzles; and
 a waste liquid line through which the supplied chemical solution and the supplied pure water are collected and discharged, the method comprising:
 a pipe cleaning step of introducing pure water containing micro-nano bubbles into the pure water supply line to clean a pipe of the pure water supply line.

[2] The method of cleaning a pipe of a single-wafer processing wafer cleaning apparatus, according to [1] above, wherein the pure water supply line is provided with a three-way valve, one of two outlet ports of the three-way valve is connected to the pure water supply nozzle, and the other outlet port is connected to the waste liquid line; and in the pipe cleaning step, the pure water containing micro-nano bubbles is introduced into the pure water supply line with the outlet port of the three-way valve on the waste liquid line side being selected.

[3] The method of cleaning a pipe of a single-wafer processing wafer cleaning apparatus, according to [1] above, wherein in the pipe cleaning step, the pure water supply nozzle is pulled away from the wafer, and the pure water containing micro-nano bubbles is supplied to a treatment cup that is placed adjacent to the stage and connected to the waste liquid line.

[4] The method of cleaning a pipe of a single-wafer processing wafer cleaning apparatus, according to [1] above, wherein a three-way valve is provided between the pure water supply nozzle on the wafer back side and the pure water supply line; and one of two outlet ports of the three-way valve is connected to the pure water supply nozzle on the wafer back side, and the other outlet port is connected to the waste liquid line, and in the pipe cleaning step, while the pure water containing micro-nano bubbles is introduced into the pure water supply line with the outlet port of the three-way valve on the waste liquid line side being selected; the pure water supply nozzle on the wafer front side is pulled away from the wafer, and the pure water containing micro-nano bubbles is supplied to a treatment cup that is placed adjacent to the stage and connected to the waste liquid line.

[5] The method of cleaning a pipe of a single-wafer processing wafer cleaning apparatus, according to any one of [1] to [4] above,
wherein the pipe cleaning step is performed every time after cleaning of one wafer.

[6] The method of cleaning a pipe of a single-wafer processing wafer cleaning apparatus, according to any one of [1] to [5] above, the method comprising:
a wafer cleaning step of performing cleaning by spraying the chemical solution onto either or both of a front surface and a back surface of a wafer;
a wafer rinsing step of performing rinsing by spraying the pure water free of micro-nano bubbles onto the either or both of the front surface and the back surface of the wafer; and
a wafer drying step of performing drying by rotating the wafer without supplying either or both of the chemical solution and the pure water free of micro-nano bubbles onto the wafer surfaces,
wherein the pipe cleaning step is performed concurrently with the wafer drying step.

[7] The method of cleaning a pipe of a single-wafer processing wafer cleaning apparatus, according to [6] above,
wherein the pipe cleaning step includes:
a first step of supplying the pure water containing micro-nano bubbles; and
a second step of supplying pure water free of micro-nano bubbles after the first step.

[8] The method of cleaning a pipe of a single-wafer processing wafer cleaning apparatus, according to any one of [1] to [4] above, wherein the pipe cleaning step is adapted to be automatically performed at a predetermined cleaning interval.

[9] The method of cleaning a pipe of a single-wafer processing wafer cleaning apparatus, according to [8] above, wherein the predetermined cleaning interval is automatically set depending on a result of evaluating a number of particles on the wafer.

[10] The method of cleaning a pipe of a single-wafer processing wafer cleaning apparatus, according to [8] above, wherein particles contained in the pure water passing through the pure water supply nozzle are monitored using a particle counter used to count the particles in a liquid, and the predetermined cleaning interval is set depending on the number of particles monitored.

Advantageous Effect

This disclosure can prevent a sudden increase in the number of particles detected on wafer surfaces even when cleaning of a wafer is performed repeatedly using a single-wafer processing wafer cleaning apparatus.

BRIEF DESCRIPTION OF THE DRAWINGS

In the accompanying drawings:
FIG. 3A is a side view and FIG. 3B is a top view.

DETAILED DESCRIPTION

Figure 1:
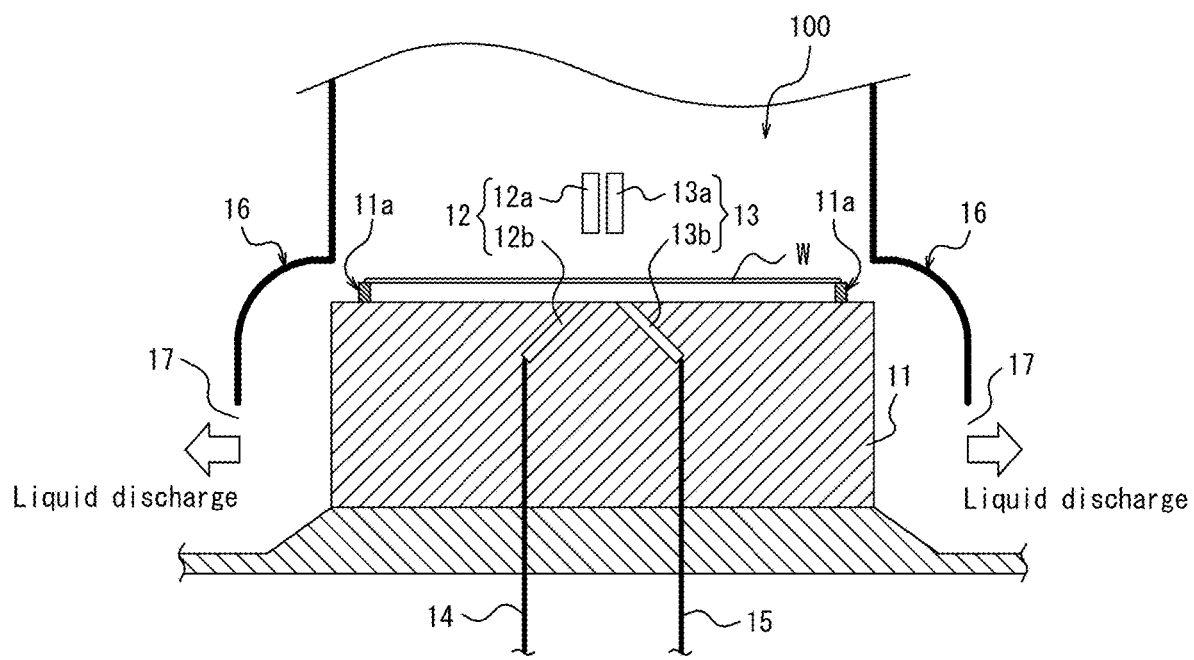
FIG. 1 is a diagram illustrating an example of a typical single-wafer processing wafer cleaning apparatus.

Embodiments of this disclosure will now be described with reference to the drawings. This disclosure proposes a method of cleaning a pipe of a single-wafer processing wafer cleaning apparatus including a rotatable stage on which a wafer is placed; chemical solution supply nozzles through which chemical solutions are supplied to the wafer placed on the stage from either or both of the wafer front side and the wafer back side; pure water supply nozzles through which pure water is supplied to the wafer placed on the stage from the either or both of the wafer front side and the wafer back side; a chemical solution supply line through which the chemical solutions are supplied to the chemical solution supply nozzles; a pure water supply line through which the pure water is supplied to the pure water supply nozzles; and a waste liquid line through which the supplied chemical solution and the supplied pure water are collected and discharged. This method comprises a pipe cleaning step of introducing pure water containing micro-nano bubbles into the pure water supply line to clean the pipe of the pure water supply line.

Considering that when cleaning of a wafer W was repeated using a single-wafer processing wafer cleaning apparatus, the number of particles detected on the surfaces of the wafer W suddenly increased as described above, the present inventor diligently studied the cause of this. Thus, the inventor considered that particles accumulated inside the pipe of the pure water supply line 15 would have been emitted and have attached to the surfaces of the wafer when pure water was supplied to the wafer W in the wafer rinsing step.

Specifically, pure water used in the wafer rinsing step in the cleaning step is divided to be supplied to cleaning apparatuses from the main pure water supply line of the factory, and the supply is performed while removing metals and particles using a filter. However, in the removal using a filter as described above, the particles are not sufficiently removed in most cases although depending on, for example, the opening diameter of the filter. Further, when a new pipe of the pure water supply line 15 is introduced, the inside of the pipe is cleaned by supplying pure water into the pipe for a while and the pipe is used after the pipe meets a predetermined requirement when the quality of the pure water flown inside is tested; however, the pipe is often not subjected to maintenance after that. Accordingly, it is possible that particles accumulated in the joints and valves of the pure water supply line 15 in each cleaning apparatus are then suddenly flown out to be supplied to the surfaces of the wafer W in the wafer rinsing step, and are deposited on the wafer W.

The present inventor diligently studied ways to remove the particles attached to the inside of the pipe of the pure water supply line 15 by cleaning the pipe, based on the above presumption. Flushing by continuously supplying pure water to the pure water supply line 15 may be effective, but requires a lot of time and would not sufficiently remove particles accumulated in the joints and valves. As such, the present inventor diligently studied ways other than flushing and conceived of cleaning the inside of the pipe of the pure water supply line 15 by supplying pure water containing micro-nano bubbles (hereinafter may also be referred to as "micro-nano bubble-containing water").

Micro-nano bubble-containing water is a gas-liquid mixture that is pure water containing minuscule bubbles sized in micrometers and nanometers, and has been used as cleaning water for removing deposits deposited on a surface of an object to be cleaned in recent years. For example, in JP 2013-248582 A, micro-nano bubble-containing water is used as a cleaning water for cleaning electronic materials including a wafer.

However, in the wafer rinsing step, when the micro-nano bubble-containing water introduced into the pure water supply line 15 is supplied to the surfaces of the wafer W from the pure water supply nozzles 13, the particles having been removed from the pipe of the pure water supply line 15 by micro-nano bubbles would be deposited on the surfaces of the wafer W. As such, the present inventor found that the particles can be efficiently removed in a short time by introducing micro-nano bubble-containing water into the water supply line 15 to supply the micro-nano bubble-containing water to other than the wafer W, thus this disclosure has been made. Now, although detailed below, "supplying micro-nano bubble-containing water to other than the wafer W" refers to, for example, supplying the micro-nano bubble-containing water directly to the waste liquid line 17 through a three-way valve, keeping it from contact with the surface of the wafer W; and supplying the micro-nano bubble-containing water to the upper nozzle 13a of the pure water supply nozzles 13 after backing (pulling away) the upper nozzle 13a from above the wafer W thereby supplying it to a treatment cup directly connected to the waste liquid line 17.

In this disclosure, the diameter of the micro-nano bubbles in the micro-nano bubble-containing water is preferably 0.1 μm or more and 10 μm or less. The micro-nano bubbles with the diameters in the above range can efficiently remove the particles deposited on the surfaces of the wafer W.

Further, the number density of the micro-nano bubbles is preferably $1\times10^5/cm^3$ or more and $1\times10^{10}/cm^3$ or less. When the number density of the micro-nano bubbles is $1\times10^5/cm^3$ or more, the effect in cleaning inside the pipe of the pure water supply line 15 can be increased. Although the upper limit of the number density of the micro-nano bubbles is not limited in terms of the cleaning effect, since micro-nano bubbles having a number density exceeding $1\times10^{10}/cm^3$ are hardly formed, thus the number density is preferably $1\times10^{10}/cm^3$ or less.

The flow rate of the micro-nano bubble-containing water is preferably 0.5 L/min or more and 2.0 L/min or less. When the flow rate of the micro-nano bubble-containing water is 0.5 L/min or more, the effect in cleaning inside the pipe of the pure water supply line 15 can be increased. Further, since the cleaning effect stays unchanged even when the flow rate of the micro-nano bubble-containing water exceeds 2.0 L/min, the flow rate of the micro-nano bubble-containing water is preferably 2.0 L/min or less.

The time during which the micro-nano bubble-containing water is introduced is set to a time equal to or more than the time in which the water in the pure water supply nozzles 13 is replaced and equal to or less than the time that does not affect the wafer W productivity. Specifically, the time during which the micro-nano bubble-containing water is introduced is preferably 10 seconds or more and 30 seconds or less. When the micro-nano bubble-containing water introduction time is 10 seconds or more, the effect in cleaning inside the pipe of the pure water supply line 15 can be increased. Further, even when the micro-nano bubble-containing water introduction time exceeds 30 seconds, the cleaning effect stays unchanged, thus the micro-nano bubble-containing water introduction time is preferably 30 seconds or less.

The purity of the micro-nano bubble-containing pure water is not limited as long as adequate product quality can be achieved, and may be of so-called pure water level (for example, resistivity: 0.1 MΩ·cm to 15 MΩ·cm), or may be of ultrapure water level (for example, resistivity: higher than 15 MΩ·cm).

Figure 2:
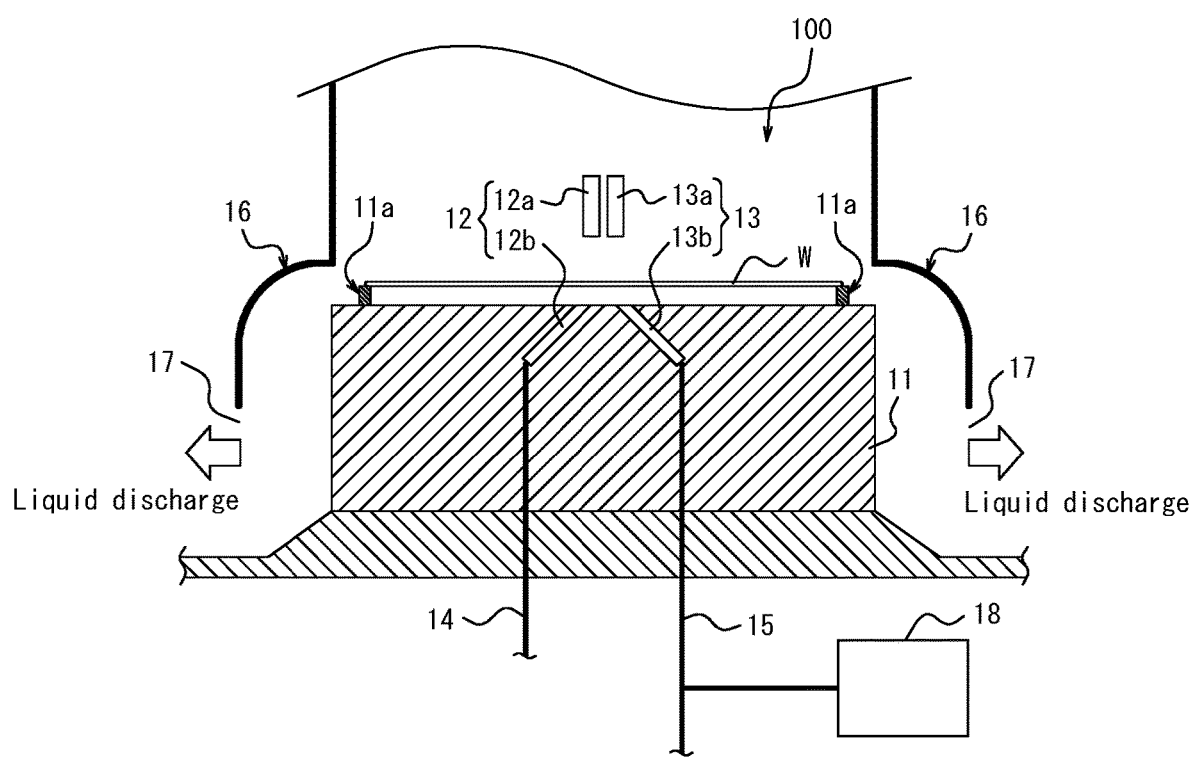
FIG. 2 is a diagram in which a micro-nano bubble generating device is connected to a pure water supply line of the single-wafer processing wafer cleaning apparatus illustrated in FIG. 1.

The above micro-nano bubble-containing water can be generated by connecting a micro-nano bubble generating device 18 to the pure water supply line 15 as illustrated in FIG. 2 and mixing micro-nano bubbles generated by the micro-nano bubble generating device 18 into the pure water in the pure water supply line 15.

Introducing the micro-nano bubble-containing water generated as described above into the pure water supply line 15 can clean the pipe of the pure water supply line 15 thereby removing the particles deposited inside the pipe.

For the position to which the above micro-nano bubble-containing water is introduced, since the timing of the wafer rinsing step in each single-wafer processing wafer cleaning apparatus 100 varies, if the micro-nano bubble-containing water is introduced from upstream of the branchpoint in the pure water supply line 15 where the water is divided into each single-wafer processing wafer cleaning apparatus, the micro-nano bubble-containing water may be supplied onto the wafer W. Accordingly, the micro-nano bubble-containing water is preferably introduced to the pure water supply line 15 of each cleaning apparatus (that is, downstream of the above branchpoint).

On the other hand, for the position where the micro-nano bubble-containing water is emitted, since the pure water supply line 15 is connected to the pure water supply nozzles 13, the micro-nano bubble-containing water introduced into the pure water supply line 15 is sprayed from the pure water supply nozzles 13. At this point, if the micro-nano bubble-containing water is sprayed to the wafer W with the wafer W being placed on the stage 11, the particles removed by the micro-nano bubble-containing water would be deposited on the surfaces of the wafer W.

Figure 3A:
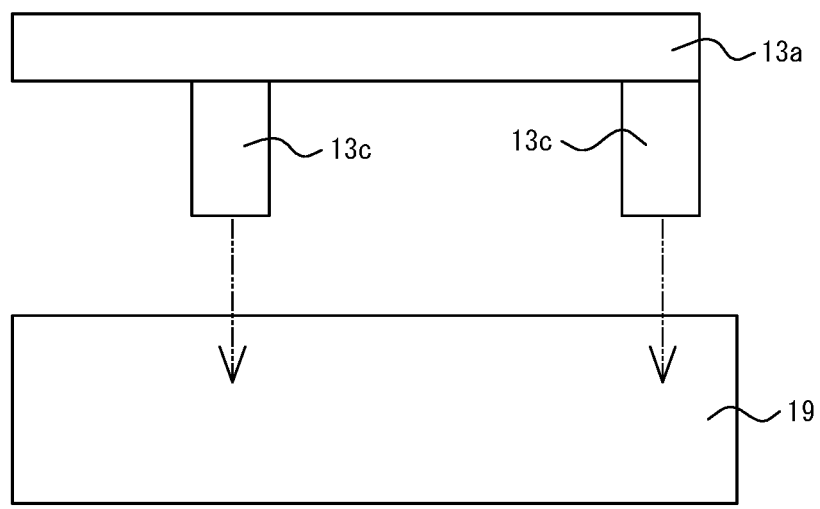
FIGS. 3A and 3B are diagrams illustrating a method of cleaning a pipe of a single-wafer processing wafer cleaning apparatus of this disclosure, where
Figure 3B:
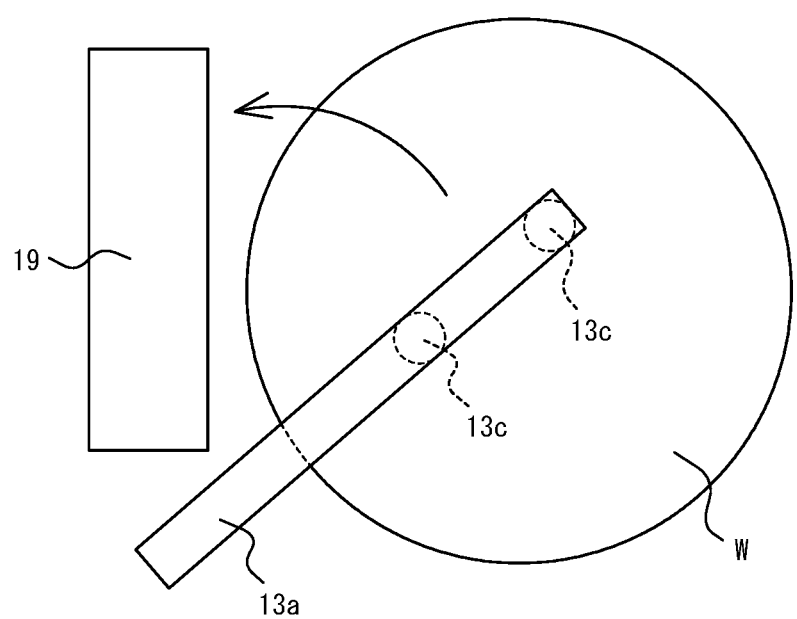

In the single-wafer processing wafer cleaning apparatus, as schematically illustrated in FIGS. 3A and 3B, when the upper nozzle 12a of the chemical solution supply nozzles 12 and the upper nozzle 13a of the pure water supply nozzles 13 are pulled away from the wafer W, the treatment cup 19 that receives the chemical solution and pure water dropped from the upper nozzles 12a and 13a is provided such that the chemical solution and pure water received by the treatment cup 19 are kept from contact with the wafer W. Further, the bottom of the treatment cup 19 is provided with an outlet leading to the waste liquid line 17, and the chemical solution and pure water received by the treatment cup 19 is discharged into the waste liquid line 17. The treatment cup 19 is placed adjacent to the stage 11 leaving a space where the upper nozzles 12a and 13a can be pulled away, and for example, is placed adjacent to the outside of the spin cup 16. This being the case, as illustrated in FIG. 3B, while the upper nozzle 13a of the pure water supply nozzles 13 is rotated in the radial direction of the wafer W to be pulled away from the wafer W, micro-nano bubble-containing water is introduced into the pure water supply line 15 to deliver the pure water after cleaning from a spray hole 13c of the upper nozzle 13a to the treatment cup 19, thus the micro-nano bubble-containing water can be discharged into the waste liquid line while being kept from contact with the wafer surface. Consequently, the inside of the pipe of the pure water supply line 15 can be cleaned while preventing the particles removed from the inside of the pipe of the pure water supply line 15 from being deposited on the surface of the wafer W. Note that the configuration of the treatment cup 19 is not limited to the above, and the treatment cup may be configured to deliver the micro-nano bubble-containing water received from the upper nozzle 13a to the waste liquid line 17 while being kept from contact with the wafer W.

Figure 4:
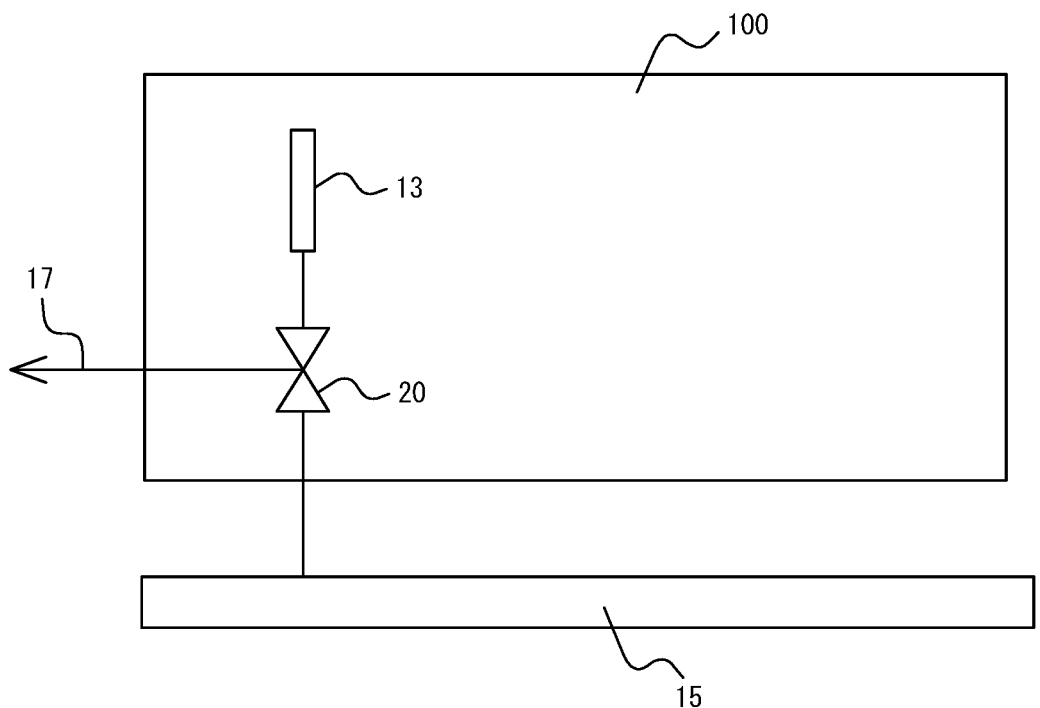
FIG. 4 is a diagram illustrating another example of a method of cleaning a pipe of a single-wafer processing wafer cleaning apparatus of this disclosure.

Further, as schematically illustrated in FIG. 4, the pure water supply line 15 is provided with a three-way valve 20, and one of the two outlet ports of the three-way valve 20 is connected to the pure water supply nozzle 13, and the other outlet port is connected to the waste liquid line 17; and micro-nano bubble-containing water is introduced into the pure water supply line 15 with the outlet port of the three-way valve 20 connected to the waste liquid line 17 being selected, thus the micro-nano bubble-containing water can be discharged into the waste liquid line 17 while being kept from contact with the surfaces of the wafer W. Consequently, the inside of the pipe of the pure water supply line 15 can be cleaned while preventing the particles removed from the inside of the pipe of the pure water supply line 15 from being deposited on the surfaces of the wafer W.

Alternatively, it is possible that a three-way valve 20 is provided between the lower nozzle 13b that is the pure water supply nozzle on the wafer back side and the pure water supply line 15; one of the two outlet ports of the three-way valve 20 is connected to the lower nozzle 13b, and the other outlet port is connected to the waste liquid line 17; and in the pipe cleaning step, while micro-nano bubble-containing water is introduced into the pure water supply line 15 with the outlet port of the three-way valve 20 on the waste liquid line 17 side being selected, the upper nozzle 13a that is the pure water supply nozzle on the wafer front side is pulled away from the wafer W, thereby supplying the micro-nano bubble-containing water to the treatment cup 19 that is placed adjacent to the stage 11 and is connected to the waste liquid line 17.

The above pipe cleaning step is preferably performed every time after cleaning of one wafer W. This can ensure that the particles deposited on the wafer W can be prevented from suddenly increasing.

Note however that the pipe cleaning step is not necessarily performed every time after cleaning of one wafer W and may be adapted to automatically perform the pipe cleaning step at a predetermined cleaning interval. The predetermined cleaning interval may be set for example by previously determining the interval at which particles suddenly increases and selecting an interval shorter than the interval at which particles suddenly increases. Further, the predetermined cleaning interval may be automatically set depending on the result of evaluating the number of particles on the wafer W in the quality inspection step. Further, the particles contained in the pure water passing through the pure water supply nozzles 13 are monitored using a particle counter used to count particles in a liquid, and the predetermined cleaning interval may be set depending on the number of monitored particles. The monitoring of the particles contained in the pure water is preferably performed when the content of the pipe of the pure water supply line 15 is replaced with pure water by supplying pure water free of micro-nano bubbles into the pure water supply line 15 after discharging the micro-nano bubble-containing water; when dummy dispense of pure water free of micro-nano bubbles is performed before wafer cleaning; or the like.

Figure 5:
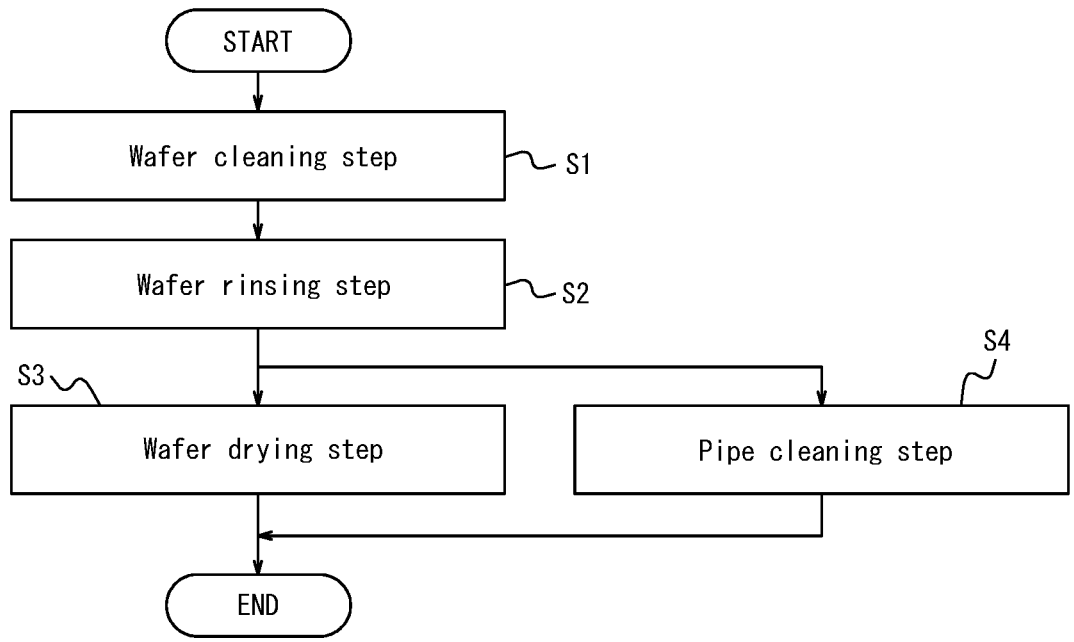
FIG. 5 is a flowchart of a typical wafer cleaning method using a single-wafer processing wafer cleaning apparatus, in which a pipe cleaning step of this disclosure is used.

Further, the pipe cleaning step of this disclosure can be suitably combined with an existing wafer cleaning method (that is, a cleaning step in a wafer production process). FIG. 5 presents a flowchart of a typical wafer cleaning method using a single-wafer processing wafer cleaning apparatus, in which the pipe cleaning step of this disclosure is used. As illustrated in FIG. 5, a typical wafer cleaning method using a single-wafer processing wafer cleaning apparatus has a wafer cleaning step S1 of performing cleaning by spraying the chemical solution onto either or both of a front surface and a back surface of a wafer; a wafer rinsing step S2 of performing rinsing by spraying pure water free of micro-nano bubbles onto the either or both of the front surface and the back surface of the wafer; and a wafer drying step S3 of performing drying by rotating the wafer without spraying one or both of the chemical solution and the pure water free of micro-nano bubbles onto the wafer surfaces. The pipe cleaning step S4 of this disclosure is preferably performed concurrently with the wafer drying step S3 of the above wafer cleaning method, thus cleaning of the wafer W and cleaning of the pipe of the single-wafer processing wafer cleaning apparatus can be performed at the same time while keeping the particles removed from the inside of the pipe by the micro-nano bubble-containing water from being deposited on the wafer W. Note that "pure water free of micro-nano bubbles" means pure water that is substantially free of micro-nano bubbles, into which no micro-nano bubbles from the micro-nano bubble generating device are mixed.

As describe above, when the pipe cleaning step of this disclosure is combined with the steps of the wafer cleaning method, the step of supplying pure water free of micro-nano bubbles (second step) is preferably performed after the step of supplying pure water containing micro-nano bubbles (first step). This can prevent the remainder of the micro-nano bubble-containing water from being supplied onto the wafer W.

EXAMPLES

Examples of this disclosure will now be described; however, this disclosure is not limited to Examples below.

Conventional Example

Nine hundred silicon wafers were consecutively cleaned using the single-wafer processing wafer cleaning apparatus 100 depicted in FIG. 1. Specifically, for each silicon wafer to be cleaned, the silicon wafer was introduced into the single-wafer processing wafer cleaning apparatus 100 and placed on the stage 11. Next, while rotating the stage 11, the front and back surfaces of the silicon wafer were cleaned by spraying 1% hydrofluoric acid aqueous solution and ozone water alternately and repeatedly from the chemical solution supply nozzles 12 (wafer cleaning step). Subsequently, pure water was supplied from the pure water supply line 15 to rinse the front and back surfaces of the silicon wafer (wafer rinsing step). After that, the silicon wafer was rotated at a high rate to dry the silicon wafer (wafer drying step). Subsequently, particles deposited on the surfaces of the silicon wafer having been cleaned were counted as light point defects (LPDs) using a surface inspection system (Surfscan SP2 manufactured by KLA-Tencor Corporation). The detection mode used at that time was the DCO (Darkfield Composite Oblique) mode, and LPDs with a size of 45 nm or more were counted. The results are given in FIG. 6A.

Invention Example

As with Conventional Example, 900 silicon wafers were consecutively cleaned. Note however that the silicon wafers were cleaned using the single-wafer processing wafer cleaning apparatus 100 depicted in FIG. 2, and at that time, cleaning of the pipe of the pure water supply line 15 was performed concurrently with the wafer drying step as illustrated in FIG. 5 (pipe cleaning step). Specifically, in the pipe cleaning step, a bubble generating device obtained by modifying a typical bubble device to have a structure that can be applied to pure water was connected to the pure water supply line 15, and micro-nano bubble-containing water was supplied to the pure water supply line 15. All the other conditions were the same as those in Conventional Example. The number of LPDs detected is given in FIG. 6B.

Figure 6A:
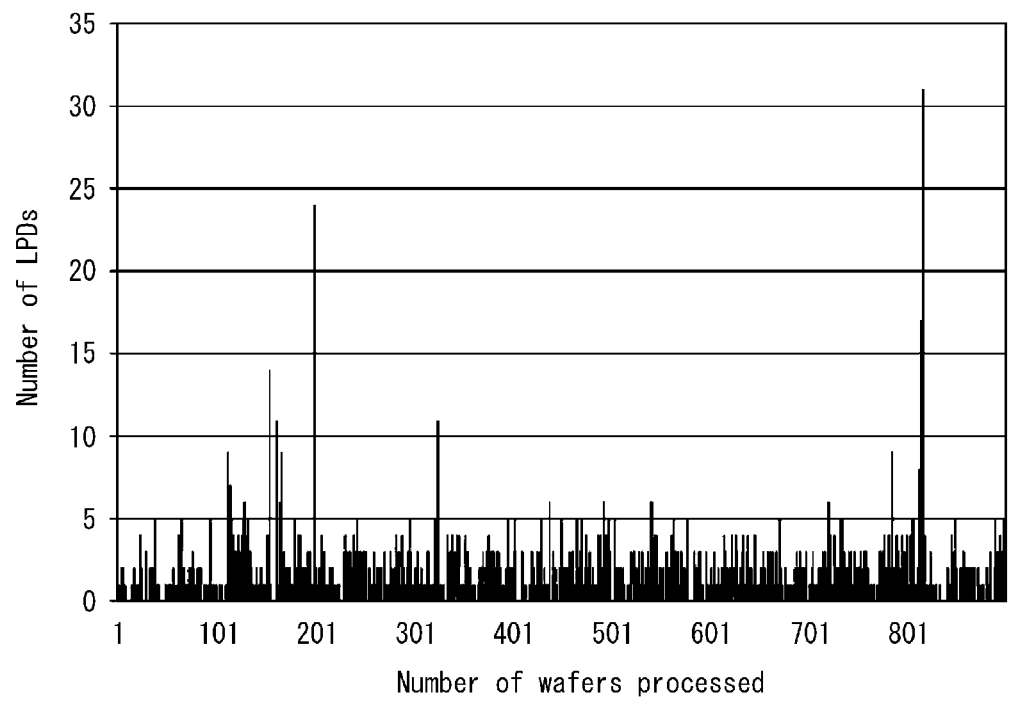
FIGS. 6A and 6B are diagrams illustrating the variation of the number of particles on silicon wafers when silicon wafers are cleaned consecutively, which relate to Conventional Example and Invention Example, respectively.
Figure 6B:
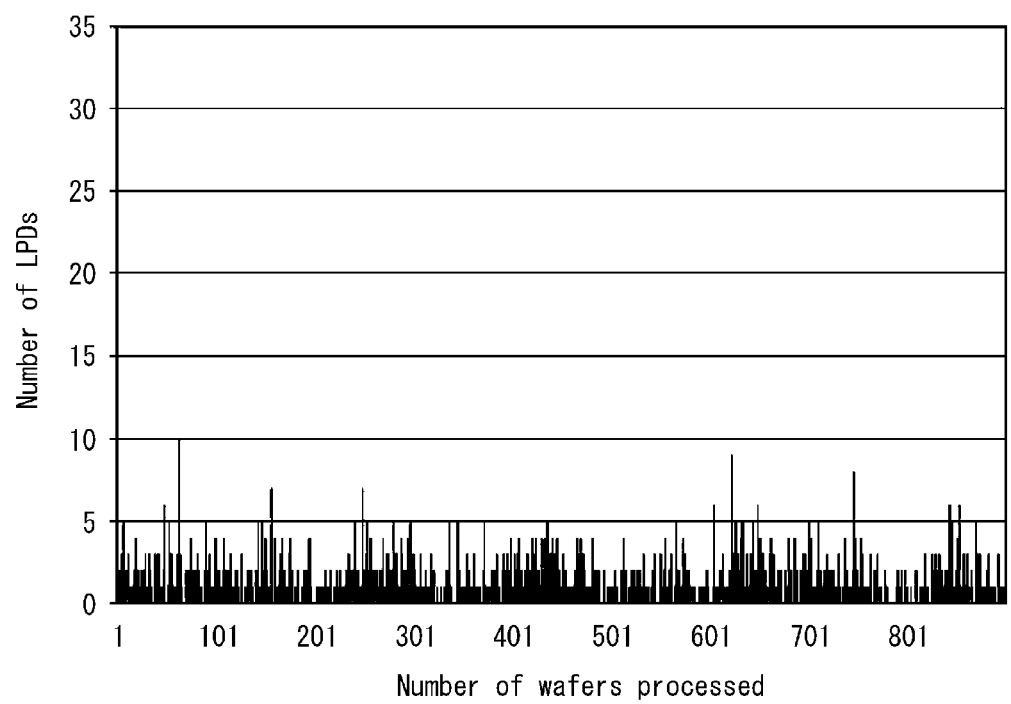

As given in FIG. 6A, in Conventional Example, the number of LPDs, that is, the number of particles suddenly increased at a frequency of approximately every 600th silicon wafer. By contrast, in Example, as given in FIG. 6B, although 900 silicon wafers were consecutively cleaned, the number of particles did not suddenly increase.

INDUSTRIAL APPLICABILITY

This disclosure can prevent a sudden increase in the number of particles detected on wafer surfaces even when cleaning of a wafer W is performed repeatedly using a single-wafer processing wafer cleaning apparatus, thus the method of cleaning a pipe of a single-wafer processing wafer cleaning apparatus, according to this disclosure is useful in the semiconductor industry.

REFERENCE SIGNS LIST

11: Stage
11a: Wafer retainer portion
12: Chemical solution supply nozzle
12a, 13a: Upper nozzle
12b, 13b: Lower nozzle
13: Pure water supply nozzle
13c: Spray hole
14: Chemical solution supply line
15: Pure water supply line
16: Spin cup
17: Waste liquid line
18: Micro-nano bubble generating device
19: Treatment cup
20: Three-way valve
100: Single-wafer processing wafer cleaning apparatus
W: Wafer

The invention claimed is:

1. A method of cleaning a pipe of a single-wafer cleaning apparatus, the apparatus comprising:
   a rotatable stage on which a wafer is placed;
   chemical solution supply nozzles configured to supply a chemical solution the wafer placed on the stage;
   pure water supply nozzles configured to supply pure water the wafer placed on the stage the pure water supply nozzles comprising a first pure water supply nozzle configured to supply pure water to a front surface of the wafer and a second pure water supply nozzle configured to supply pure water to a back surface of the wafer;
   a chemical solution supply line configured to supply the chemical solution to the chemical solution supply nozzles;
   a pure water supply line configured to supply the pure water to the pure water supply nozzles;
   a waste liquid line configured to collect and discharge the supplied chemical solution and the supplied pure water
   a three-way valve positioned between the second pure water supply nozzle and the pure water supply line, wherein a first outlet port of two outlet ports of the three-way valve is connected to the second pure water supply nozzle, and a second outlet port of the two outlet ports is connected to the waste liquid line; and
   a treatment cup placed adjacent to the stage and connected to the waste liquid line,
   the method comprising:
   a pipe cleaning step of introducing pure water containing micro-nano bubbles into the pure water supply line to clean a pipe of the pure water supply line, wherein
   in the pipe cleaning step, the pure water containing micro-nano bubbles is supplied to areas other than the wafer to keep the pure water containing micro-nano bubbles from contacting the wafer, and
   in the pipe cleaning step, while the pure water containing micro-nano bubbles is introduced into the pure water supply line with the second outlet port of the three-way valve being selected, the first pure water supply nozzle is pulled away from the wafer, and the pure water containing micro-nano bubbles is supplied to the treatment cup.

2. The method according to claim 1,
   wherein the pipe cleaning step is performed every time after cleaning of one wafer.

3. The method according to claim 1, the method comprising:
   a wafer cleaning step of performing cleaning by spraying the chemical solution onto the wafer;
   a wafer rinsing step of performing rinsing by spraying a pure water free of micro-nano bubbles onto the wafer; and a wafer drying step of performing drying by rotating the wafer without supplying either or both of the chemical solution and the pure water free of micro-nano bubbles onto the wafer, wherein the pipe cleaning step is performed concurrently with the wafer drying step.

4. The method according to claim 3, wherein the pipe cleaning step includes:

a first step of supplying the pure water containing micro-nano bubbles; and a second step of supplying the pure water free of micro-nano bubbles after the first step.

5. The method according to claim 1, wherein the pipe cleaning step is automatically performed at a predetermined cleaning interval.

6. The method according to claim 5, wherein the predetermined cleaning interval is automatically set depending on a result of evaluating a number of particles on the wafer.

7. The method according to claim 5, wherein particles contained in the pure water passing through the pure water supply nozzles are monitored using a particle counter, and the predetermined cleaning interval is set depending on a number of particles monitored.

\* \* \* \* \*